United States Patent
Ohashi et al.

(10) Patent No.: US 8,569,177 B2
(45) Date of Patent: Oct. 29, 2013

(54) PLASMA PROCESSING APPARATUS AND PLASMA PROCESSING METHOD

(75) Inventors: Tomohiro Ohashi, Shunan (JP); Akitaka Makino, Hikari (JP); Hiroho Kitada, Kudamatsu (JP); Muneo Furuse, Kudamatsu (JP); Tomoyuki Tamura, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/570,433

(22) Filed: Aug. 9, 2012

(65) Prior Publication Data

US 2013/0189800 A1  Jul. 25, 2013

(30) Foreign Application Priority Data

Jan. 25, 2012  (JP) ................. 2012-012609

(51) Int. Cl.
*H01L 21/302* (2006.01)
(52) U.S. Cl.
USPC .................... 438/710; 438/707; 257/E21.218
(58) Field of Classification Search
USPC ................. 438/707, 709, 718; 257/E21.222, 257/E21.305
See application file for complete search history.

(56) References Cited

U.S. PATENT DOCUMENTS

2012/0241090 A1\*  9/2012  Yoshikawa et al. ...... 156/345.41

FOREIGN PATENT DOCUMENTS

| JP | 59-9171 | 1/1984 |
|----|---------|--------|
| JP | 61-52374 | 3/1986 |
| JP | 63-126682 | 5/1988 |
| JP | 63-317680 | 12/1988 |

\* cited by examiner

*Primary Examiner* — Cheung Lee
(74) *Attorney, Agent, or Firm* — Antonelli, Terry, Stout & Kraus, LLP.

(57) ABSTRACT

A plasma processing apparatus is provided which includes an inert gas supply route connected to a process gas supply piping which supplies a process gas into a processing chamber in a vacuum vessel, a valve which opens or closes the inert gas supply route, and an adjuster which adjusts a flow rate of the inert gas. When processing of a sample is complete, an inert gas is supplied into the process gas supply piping so that a pressure in the process gas supply piping is maintained at a pressure higher than a pressure at which a compound of the process gas and a material of an inner wall of the process gas supply piping vaporizes.

4 Claims, 7 Drawing Sheets

PLASMA PROCESSING APPARATUS AND PLASMA PROCESSING METHOD

BACKGROUND OF THE INVENTION

The present invention relates to a plasma processing apparatus and a plasma processing method in which a substrate-like sample such as a semiconductor wafer is processed and, more particularly, to a plasma processing apparatus and a plasma processing method in which etching processing is processed on a sample using plasma generated in a processing chamber disposed in a vacuum vessel by supplying process gases into the processing chamber through gas piping.

In fabrication of semiconductor devices, a plasma processing apparatus using plasma is widely used. In an etching processing apparatus, in particular, a semiconductor wafer is held on a stage within a processing chamber disposed in a vacuum vessel, an electric or magnetic field is supplied into the processing chamber while process gases suitable for processing of materials of a structure of a thin film for configuring semiconductor circuits which is formed in advance on a top surface of the semiconductor wafer are supplied into the processing chamber so that particles of the process gases are excited to generate plasma, and the film structure is processed along a mask arranged thereon.

In such a step of performing processing of a film structure on a semiconductor wafer, a gas containing a substance highly reactive with silicon (which is denoted merely by Si, hereinafter) compound which forms a semiconductor circuit structure, aluminum (which may be denoted merely by Al, hereinafter) alloy, or the like or, for example, a halogen-based element is generally used. As for gas supply lines for supplying such a gas into a processing chamber within a vacuum vessel, materials of excellent corrosion resistance are used in general for a member in contact with the gas or, in particular, gas supply piping which is a member used in gas introduction lines; for example, a stainless steel (SUS316L in Japan Industrial Standard designation) is used for an inner wall of a pipe for supplying a gas containing chlorine or a compound thereof as an element of a composition.

Nevertheless, an etching apparatus of a prior art has a problem that elements of iron (Fe), chromium (Cr), and nickel (Ni) which composes the stainless steel used for the supply piping reacts mutually with the process gases to form substances which flow along the gas flow into the processing chamber so that surfaces of a sample, the members disposed on the route of sample transfer, or a transfer robot are contaminated as the substances depositing on the top surface of the sample or remaining around its top surface as a gas.

To solve such a problem, in a plasma processing apparatus of a prior art, those with chromium passivity coating formed on the surface are used as members in contact with highly reactive process gases. As such a prior art technique, it is known to form a hard film made of fine particles of chromium (III) oxide ($Cr_2O_3$) on the surface of a stainless-steel base material by chemically changing chromium (VI) oxide ($CrO_3$) and as examples of such techniques, those in JP-A-59-009171, JP-A-61-052374, JP-A-63-126682, and JP-A-63-317680 are known.

SUMMARY OF THE INVENTION

However, in the aforementioned prior art technique considerations are not paid sufficiently in the following aspect so that a problem arises. Namely, such passivity coating of chromium oxide or the like formed on the surfaces of members facing to highly reactive gases such as the inner wall of the aforementioned piping does not have sufficient corrosion resistance performance or passivity for all the conditions of operations variously changing when a plasma processing apparatus is operated.

For example, there arises a problem that processing conditions such as sample processing temperature or pressure can be varied according to the film structure to be processed on the surface of the sample, and with respect to the above-described base material (stainless steel) facing to the gases the substances of the coating formed on the surface of the members are vaporized or liberated, flow into the processing chamber, and adhere to the surface of the sample in part of such conditions. In particular, according to investigations by the inventors of the present invention, knowledge has been obtained that contamination of the sample by metallic components comprising of the inner surface of the piping increases when gases of substances containing chlorine or chloride are used or when so called cleaning is performed in which products or deposits adhered onto the inner wall of the processing chamber are removed by generating plasma in the processing chamber using gases containing halogen-based compounds such as chlorine trifluoride gas.

In the prior art technique described above, no consideration is paid to the aspect of rising the aforementioned problem. An objective of the present invention is to provide a plasma processing apparatus or a plasma processing method which can reduce contamination of a sample and increase a yield of processing.

The above objective is attained by providing a plasma processing apparatus or a plasma processing method which includes a processing chamber with a process gas supplied thereinto and plasma generated therein, and an inert gas supply route connected to and communicated with a process gas supply piping through which a process gas is supplied into, wherein the inert gas is supplied to the process gas supply piping when processing of a sample such as a semiconductor wafer in the processing chamber is completed so that a pressure in the supply piping is maintained at a pressure higher than a pressure at which a compound of the process gas and a material constituting the inner wall of the supply piping vaporizes.

Other objects, features, and advantages of the invention will become apparent from the following description of the embodiments of the invention taken in conjunction with the accompanying drawings.

DESCRIPTION OF THE EMBODIMENTS

Embodiments of the present invention are explained hereinafter with reference to the attached drawings.

Embodiment 1

Embodiment 1 of the present invention is explained below by referring to FIGS. 1 to 5. In the present embodiment, an example of plasma etching apparatuses in which electric and magnetic fields are supplied into a processing chamber disposed in a vacuum vessel to generate an electron cyclotron resonance (ECR) in atoms and molecules of gases supplied into the processing chamber due to their interactions so that plasma is generated and a sample is processed with etching; it is, however, applicable for plasma apparatuses in which plasma is formed due to other couplings such as generation of capacitively coupled plasma or inductively coupled plasma.

Figure 1:
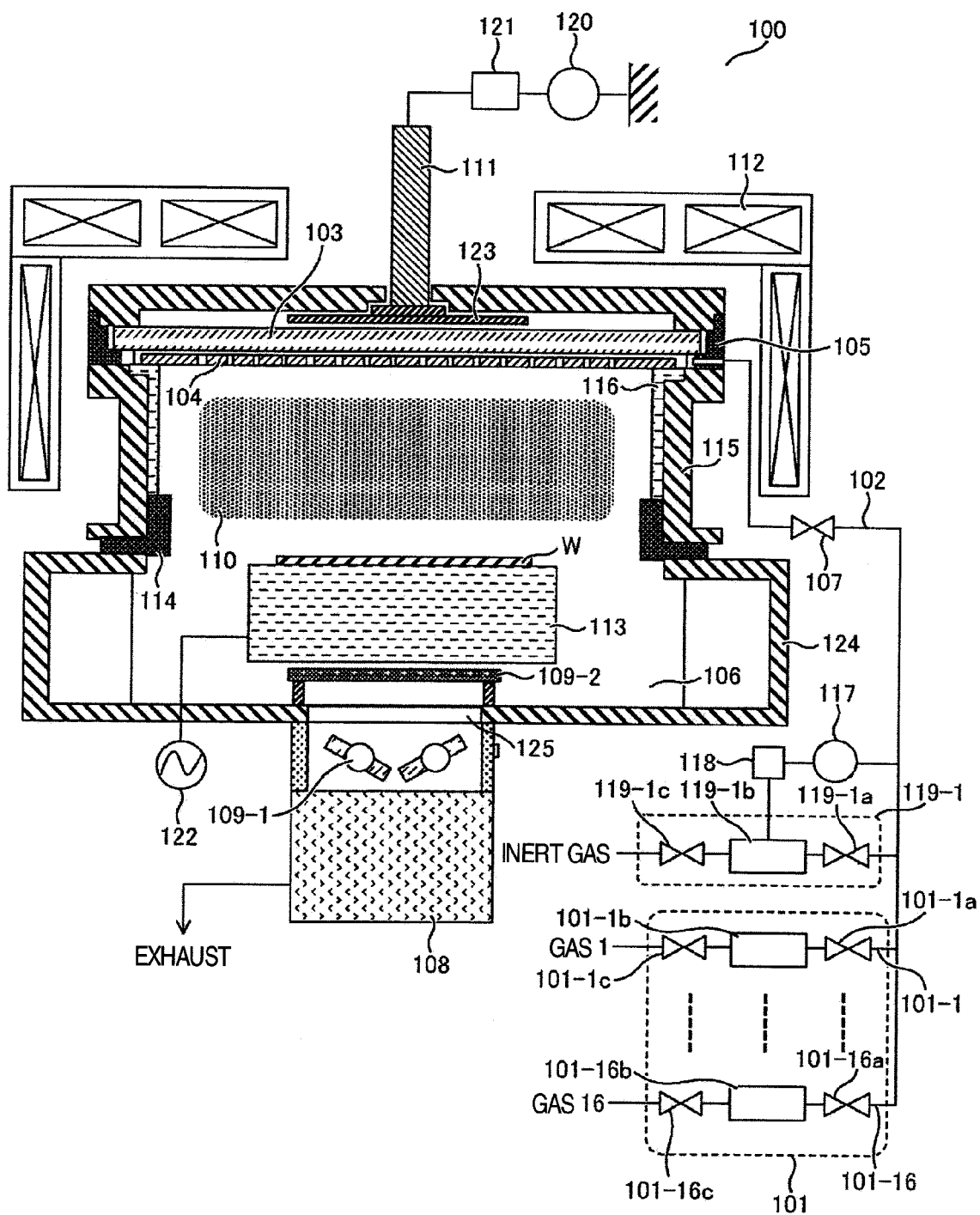
FIG. 1 is a vertical cross section of a plasma etching apparatus in accordance with Embodiment 1 of the present invention.

FIG. 1 is a vertical cross section showing a schematic of a configuration of a plasma processing apparatus in accordance with Embodiment 1 of the present invention. A plasma processing apparatus 100 in accordance with the present embodiment includes a vacuum vessel having a cylindrical shape, an electromagnetic field generator disposed above it or around its side for supplying an electric or magnetic field to the interior of the vacuum vessel, and an exhaust device disposed under the vacuum vessel for exhausting gases from the interior of the vacuum vessel to the outside of the vessel.

The vacuum vessel is structured to enclose space containing a processing chamber 106 within with material of metal having electrical conductivity, and is configured to include a side wall block 115 enclosing a discharge chamber of a cylindrical shape which is space above the processing chamber 106 and in which plasma is generated therein, a lower vessel 124 arranged to be connected thereunder to form a lower part of the vacuum vessel, and a quartz plate 103 connected above the ring-shaped top end part of the side wall block 115 and made of a material of a circle-shaped quartz. The lower vessel 124 has a sample stage 113 disposed in its central part therein, and an opening 125 in its lower bottom surface, which communicates with the interior of the processing chamber 106 and through which the gases, plasma, and particles of products in the processing chamber 106 are exhausted.

At an atmospheric pressure above the quartz plate 103 and around the outer periphery of the side wall block 115, an electromagnetic field generator is disposed to supply an electric or magnetic field into the interior of the discharge chamber or the processing chamber 106. The electromagnetic field generator is provided with an antenna 123 for supplying an electric field of a predetermined frequency into the discharge chamber from above the quartz plate 103 and a transmission path 111 through which electric power supplied to the antenna is transmitted.

The top end part of the transmission path 111 is electrically connected to a power supply 120 via a matching box 121, and it is configured so that power of a specific frequency formed by the power supply 120 passes through the transmission path 111 and is applied to the antenna 123 after being matched by the matching box 121. A solenoid coil 112 is also disposed so as to surround above and the outer peripheries of the discharge chamber.

The sample stage 113 is a member of a cylindrical shape arranged as its center position being aligned with the discharge chamber or the side wall block 115 and has in its inside a base material of a circular plate made of metal and a coolant flow channel disposed in the circular plate, in which a coolant having its temperature adjusted flows. A coating made of an insulating material is disposed on the circular top surface of the base material, and the top surface constructs a circular mounting surface on which a wafer W as a substrate-shaped sample is mounted. Further, the base material is electrically connected with a radio frequency power supply 122 which forms a radio frequency power of a frequency of a specific range different from the power supply 120, and the base material to which power from the radio frequency power supply 122 is applied is an electrode which functions to support the wafer W and also to form a potential on the wafer W.

Directly under the sample stage 113 and in the bottom surface of the processing chamber 106 surrounded by the inner wall of the lower vessel 124, the circular opening 125 is arranged, and the opening 125 communicates with an inlet of a vacuum pump 108 such as a turbo-molecular pump disposed to be connected to the bottom surface of the lower vessel 124 thereunder. In an exhaust passage which is between the vacuum pump 108 and the opening 125 and communicates them, a rotary valve 109-1 is disposed, which is constructed with a plurality of flaps to increase or decrease the cross-sectional area of an opening of the exhaust passage or a flow through the passage by rotation; above the opening 125 and between it and the bottom surface of the sample stage 113, disposed is a lid valve 109-2 structured by a circular plate member which moves up and down and closes the opening 125 hermetically when it moves to the bottom end position. In the present embodiment, the diameter of the circular opening 125 is made smaller than the diameter of the cylindrical shape of the sample stage 113, and the diameter of the circular part of the lid valve 109-2 is also made smaller than the diameter of the cylindrical shape of the sample stage 113.

On the top end of the side wall block 115 a lower ring 105 is mounted to be sandwiched with the quartz plate 103 therebetween; seal members such as O-rings are disposed between respective pairs of the side wall block 115, the lower ring 105, and the quartz plate 103 to section between the outside of the vacuum vessel and the interior of the processing chamber 106 air-tightly. Also, along and covering the cylindrical inner wall of the side wall block 115 facing space in which plasma is generated, a cover 116 constructed by a member of high plasma resistance such as a cylindrically-shaped quartz is disposed so that the inner wall of the cover 116 faces generated plasma.

Further, the cover 116 is provided at its top end with a plate-shaped flange part extending toward the outer circumferential side in a horizontal direction (right-to-left direction in the drawing), and a shower plate 104 of a planar member of a circle shape made of quartz is held on the top surface of this flange part with its outer periphery part mounted thereon and with a gap with the bottom surface of the quartz plate 103 therebetween. The shower plate 104 constructs a ceiling surface of the discharge chamber and has a plurality of through holes arranged equally spaced from each other in a circular zone at the center, opposing to the mounting surface of the sample stage 113 thereabove, and of a larger diameter than the mounting surface.

The lower ring 105 has a through hole connected with gas piping 102 including a pipe through the inside of which a gas supplied into the interior of the processing chamber 106 flows; the gas supplied into the processing chamber 106 passes through the through hole and is introduced to a gap between the quartz plate 103 and the shower plate 104 via the lower ring 105. A valve 107 for opening or closing a flow passage inside the gas piping 102 is arranged on the route of the gas piping 102 so that the flow passage of the gas piping 102 is opened or closed in accordance with intermittence of processing in the processing chamber 106.

The gas piping 102 has a junction part at the upstream side of a valve 107 where gas lines 101 of introduction routes of a plurality of gases merge. A plurality of the gas lines 101 of the present embodiment include 16 gas routes of gas lines 101-1 to 101-16 through which gases of different elements or substances of compositions (different types) pass, respectively. Gases of different species flowing through a plurality of respective gas lines 101-1 to 101-16 become a mixed process gas at the junction part, and flow toward the vacuum vessel through the inside of the gas piping 102.

On the respective gas lines 101-1 to 101-16, mass flow controllers 101-1b to 101-16b for variably increasing or decreasing flow rates or velocities of the gases flowing inside and valves 101-1a to 101-16a, 101-1c to 101-16c which open and close respective lines before and after there are arranged, and are connected further to respective gas sources at the upstream sides. Incidentally, though not illustrated, the operations of the mass flow controllers 101-1b to 101-16b, and valves 101-1a to 101-16a, 101-1c to 101-16c are adjusted by a controller 118.

Also, under a bottom end of the cylindrical shaped part of the cover 116 a grounding member 114 configured of a cylindrical member or a planar member of a ring shape constructed with electrically conductive metal is disposed to cover the inner wall of the side wall block 115 or the inside wall surface of the lower end part of the cover 116. The grounding member 114 is electrically connected to the side wall block 115 or to the lower vessel 124 and grounded so that it functions as an electrode having a constant potential with respect to the plasma generated in the discharge chamber or the electrode of the sample stage 113.

In the plasma processing apparatus 100 having such an arrangement, when the wafer W is processed, the wafer W travels through an opening (not shown) arranged in the side wall of the lower vessel 124, is transferred to above the mounting surface of the sample stage 113 while being held by a transfer robot provided outside of the vacuum vessel, and then mounted on the mounting surface to be held. The retention of the wafer W is carried out by an electrostatic adsorption force generated across the insulating coating when a DC power is applied to a film-like electrode arranged inside the coating of an insulating material forming the mounting surface.

The opening which the wafer W retained and mounted on an arm of the transfer robot passes through to be transferred into the processing chamber 106 is air-tightly closed from outside by closing operation of a gate valve (not shown), which opens or closes it from the outside of the lower vessel. After that, a process gas containing gases of chlorine-based substances such as chlorine and boron trichloride as compositions passes from the gas source via any of the mass flow controllers 101-1b to 101-16b through the gas piping 102, is introduced into a gap between the quartz plate 103 and the quartz-made shower plate 104, is diffused to fill in the gap space, and then flows through the through holes of the shower plate 104 into the processing chamber 106 from thereabove.

After the process gas introduced in the processing chamber 106 vertically moves from the discharge chamber to underneath the sample stage 113, it is exhausted to the outside from the opening 125 by the operation of the vacuum pump 108. The amount and the speed of the exhausted gas vary with the rotational speed of the vacuum pump 108 and the area of the opening according to the rotational angle of the rotary valve 109-1.

While the gas is supplied into the processing chamber 106 from the through holes above the sample stage 113, the gas is exhausted from the opening below by the vacuum pump 108. Through balance between the amount or the speed of supply of the process gas from the through holes and the amount or the speed of exhaust from the opening 125, a pressure value or a degree of vacuum within the processing chamber 106 is adjusted. After the pressure within the processing chamber 106 is made to a suitable value to conditions for processing performed subsequently, a power of a specific frequency transmitted from the power supply 120 is supplied to the antenna 123 via the transmission path 111 so that an electric field from the antenna 123 passes through the quartz plate 103 and is introduced to the processing chamber 106. Also, a magnetic field produced by the solenoid coil 112 is introduced into the processing chamber 106 so that the gas is excited and thereby plasma 110 is generated within the discharge chamber over the sample stage 113.

A radio frequency power from the radio frequency power supply 122 is applied to the base material of the circular plate made of metal in the sample stage 113 so that a bias potential having a specific value relative to the plasma 110 above the top surface of the wafer W as an etching target or the grounding member 114 is generated. Due to a potential difference between the bias potential and the potential inside the plasma 110, charged particles in the plasma 110 are drawn toward the top surface of the wafer W, whereby anisotropic etching of the film structure on the wafer W as a processing target is started.

When an end point of etching processing of the film structure is detected by detecting a frequency spectrum or intensity of emission of the plasma 110 or their changes, supply of the radio frequency power for bias from the radio frequency power supply 122 is turned off and processing of the wafer W is completed. Thereafter, while the gas in the processing chamber 106 is replaced as an inert gas is introduced while the processing chamber 106 is exhausted, the processing chamber is exhausted and decompressed to a higher degree of vacuum than that during the processing; then, the electrostatic chuck of the wafer W is released and the wafer W is transferred outside of the vacuum vessel by a vacuum transfer robot. At this time, when another unprocessed wafer W' is retained in the robot and subsequent processing of the wafer W' in the processing chamber 106 is possible, the unprocessed wafer W' is transferred in as immediately replacing after transferring out the processed wafer W, and processing is performed similar to the formerly processed wafer W.

In the present embodiment, the operations of respective parts of the plasma processing apparatus 100 described above are adjusted by the controller 118. Namely, the controller 118 is connected to communicate with a plurality of sensors arranged in the plasma processing apparatus 100 by a communication means; in the controller 118 which receives outputs from the sensors, based on an algorithm of software stored in a memory means such as RAM disposed inside, the operations of respective parts connected to communicate with the controller through a communication means such as the power supply 120, the matching box 121, the radio frequency power supply 122, the gate valve, the transfer robot, the vacuum pump 108, the rotary valve 109-1, the lid valve 109-2, the mass flow controllers 101-1b to 101-16b, 119-1b, and the valves 101-1a to 101-16a, 101-1c to 101-16c are calculated by an operator arranged inside the controller 118 and command signals for operations are transmitted to the respective parts via interfaces arranged inside. Such a controller 118 may be provided in the plasma processing apparatus 100, or may be arranged within a building where the plasma processing apparatus 100 is installed but at a remote position away from the apparatus in a way capable of communication.

Incidentally, in order to suppress adhesion of reaction products during etching on a surface, the side wall block 115 of the processing chamber 106 is adjusted for temperature of its inside surface being 80 to 100° C. by heating from a heater (not shown) disposed along its outer circumferential wall. Further, the surface of the cover 116, which covers the side wall block 115 not to be exposed directly to the plasma 110, is also made to be at 80 to 100° C.

During etching processing with the plasma 110 generated, due to heat input from the plasma 110 the shower plate 104 made of quartz and the lower ring 105 are heated to a temperature of about 130° C., and the temperature of the side wall block 115 is adjusted to be a temperature of 80 to 100° C., and, therefore, the gas piping 102 arranged in the vicinity of the processing chamber 106 and the valve 107 arranged thereto are maintained to be at a temperature of 100° C. or closer thereto.

Boron trichloride as of a chlorine-based gas used as a process gas in the present embodiment and Fe ($Fe_2O_3$ because it exists as its oxide) constituting stainless steel cause a chemical reaction such as shown by the following formula.

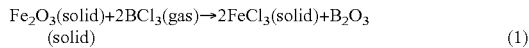

$$Fe_2O_3(\text{solid})+2BCl_3(\text{gas})\rightarrow 2FeCl_3(\text{solid})+B_2O_3(\text{solid}) \qquad (1)$$

From such a chemical reaction formula (1), one can conceive that a solid of iron chloride ($FeCl_3$) is created on the surface of the gas piping. In such a reaction, when equilibrium composition is calculated based on thermodynamic calculation, $FeCl_3$ (solid) is vaporized at the pressure inside the gas piping 102 of 0.02 Pa or less when the temperature of the gas piping 102 is 100° C. When the vaporized $FeCl_3$ passes through the gas piping 102 and introduced into the processing chamber 106 from the through holes, it solidifies and adheres on the top surface of the wafer W or the Fe component causes a mutual reaction with a material of the film structure of the wafer W to form a compound so that the wafer W may be contaminated.

Meanwhile, when a multi-layer film of a plurality of different species of layers deposited and formed on the surface of the wafer W is etched, it is necessary to perform etching processing in conditions different for the respective different layers. Therefore, a plurality of steps are provided in etching processing of the wafer W. At this time, the interior of the processing chamber 106 and the interior of the gas piping 102 are evacuated through the operation of the vacuum pump 108 between the steps so that the process gas used in a previous step and products are exhausted therefrom. At this time, the pressures in the processing chamber 106 and the pressure in the gas piping 102 become 0.02 Pa or less and a solid of iron chloride ($FeCl_3$) is vaporized to become $Fe_2Cl_6$ and brought into the processing chamber 106 to be contaminated with the metal.

In the present embodiment, aside from the gas line 101, a gas line 119-1 for supplying an inert gas such as Ar or $N_2$ is arranged in parallel with the gas line 101. The gas line 119-1 is a route of gas introduction which is connected to a gas source upstream thereof and to the gas piping 102 downstream thereof. Further, a configuration of a mass flow controller 119-1b for variably increasing or decreasing a flow rate or a speed arranged on the route and valves 119-1a, 119-1c disposed therebefore and thereafter, respectively, is the same as those in the gas lines 101-1 to 101-16.

As mentioned above, when the process gas is switched over between a plurality of processing steps (processes), the inert gas from the gas line 119-1 is supplied as a replacing gas to exhaust the gas used in the previous step during then; and besides it is also introduced into the gas piping 102 and then into the processing chamber 106 for the purpose of exhausting the gas remaining in the processing chamber 106 before the interior of the processing chamber 106 is opened to atmosphere during operation of exhausting up to a high degree of vacuum before a processing or at the time of maintenance or inspection. Adjustment of the flow rate or the speed of the inert gas with the mass flow controller 119-1b is carried out by the controller 118 based on an output of a pressure gauge 117 for detecting a pressure within the gas piping 102.

In the present embodiment, in order to reduce the flow of a vaporized gas of a metal compound in the gas piping 102 into the processing chamber 106, the pressure inside the gas piping 102 is set at a predetermined pressure or higher, at which the vaporization of the above compound can be suppressed, when the interior of the processing chamber 106 is exhausted between the plurality of steps in processing of the wafer W or when the inert gas is introduced into the processing chamber 106 for maintenance or inspection after completion of processing of the wafer W. In the present embodiment, in particular, operation of the mass flow controller 119-1b is adjusted by the controller 118 in such a manner that the pressure inside the gas piping 102 remains 10 Pa or higher.

The aforementioned adjustment is carried out according to a command signal calculated by the controller 118 based on the output of the pressure gauge 117 for detecting the pressure in the gas piping 102. In this way, by supplying the inert gas via the gas piping 102 for supplying the process gas into the processing chamber 106 between a plurality of the processing steps, while the process gas used in the previous step is exhausted from the gas piping 102 and the processing chamber 106 and replaced with the inert gas, the vaporization of substances on the inner surface of the gas piping 102 such as a passivity compound is suppressed to move on to a next processing step.

In the present embodiment, in order to keep the pressure inside the gas piping 102 at 0.02 Pa or higher, high precision and high accuracy are required in pressure measurement by the pressure gauge 117 and in adjustment of the flow rate by the mass flow controller 119-1b. However, each of the pressure gauge 117 and the mass flow controller 119-1b usually produces an error of several %. With the consideration of a conductance within the piping determined by geometries such as the lengths and the pipe diameters of the gas piping 102 and the gas lines 101, 119, it was determined that the pressure inside the gas piping 102 is required to be maintained to at least 10 Pa or higher in the present embodiment to suppress the vaporization of the substances on the inner surface described above so that the contamination is reduced.

Figure 2:
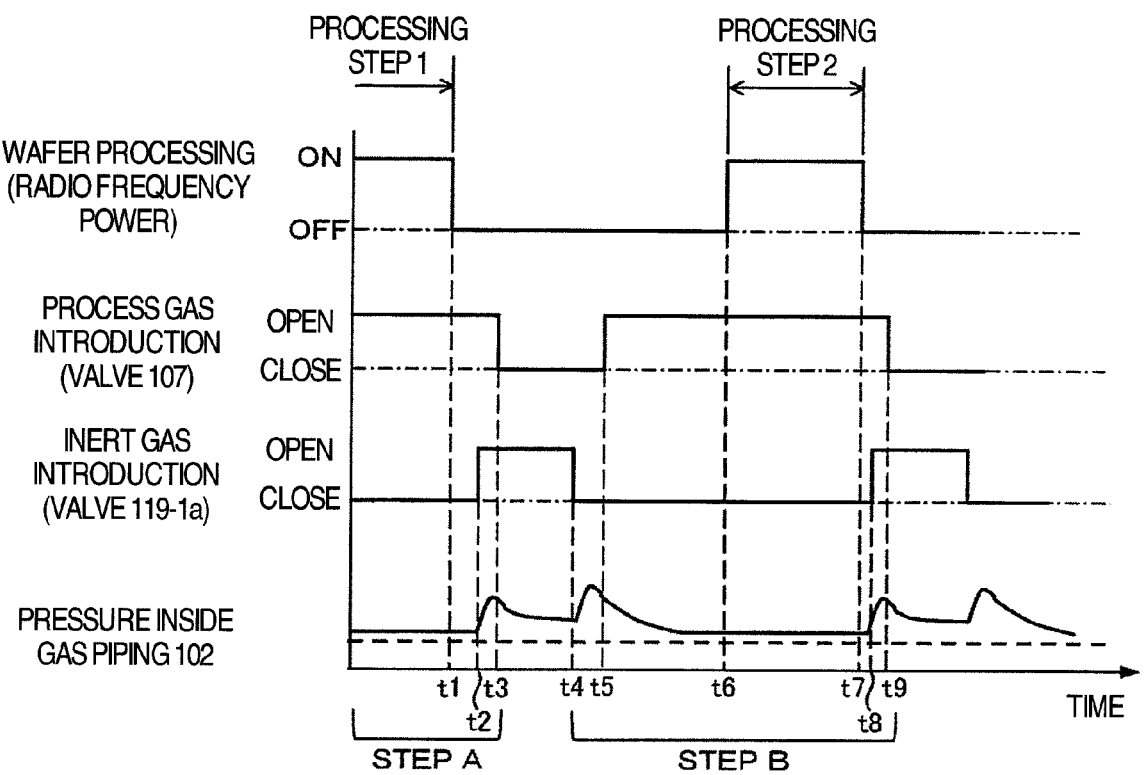
FIG. 2 is a timing chart showing an operational flow in etching processing.

FIG. 2 is a timing chart showing a flow of processing operations in the plasma processing apparatus in accordance with the embodiment shown in FIG. 1. In the present drawing operation is shown in which an arbitrary film structure to be processed on the wafer W is processed for etching in a plurality of steps including Step 1 and subsequently performed Step 2 carried out at different processing conditions; the steps are divided roughly into Steps A and B. Incidentally, the exhausting operation by the vacuum pump 108 is continuously carried out during these operations.

In this drawing, after the processing of the wafer W is completed as the supply of power from the radio frequency power supply 122 is stopped at a time t1, the valves 119-1a, 119-1c are opened at a time t2 to let the inert gas be introduced into the gas piping 102 and, as a result, the inert gas is supplied into the processing chamber 106. Incidentally, not only during the processing of the wafer W but even during a period from the time t1 to the time t2, the operation of supplying a plurality of sorts of process gases introduced from a plurality of lines of the gas lines 101-1 to 101-16 through the junction part into the gas piping 102 is continued. In the present embodiment, the pressure inside the processing chamber 106 during the processing of the wafer W is in a range of several Pa to several tenths of Pa, and, while the process gases are supplied, the pressure inside the gas piping 102 is maintained to be a pressure of 10 Pa or higher due to the balance in conductance among the through holes, a gas passage in the lower ring 105, and the gas piping 102.

From the time t2 the open states of the valves 119-1a, 119-1c are maintained to continue to supply the inert gas into the processing chamber 106; at a time t3 the valves in respective ones of the gas lines 101 corresponding to the process gases used in the Processing Step 1 are closed based on a command signal from the controller 118, whereby the supply of the process gases used in the Processing Step 1 to the gas piping 102 is stopped. The operations up to the time t3 belong to Step A.

Subsequently, the inert gas continues to be introduced into the processing chamber 106 as opening of the valves 119-1a, 119-1c is maintained. As a result, the gas inside the processing chamber 106 is replaced as the process gases remaining within the processing chamber 106 after completion of the Processing Step 1 being exhausted from the opening 125 through operation of the vacuum pump 108 as if it is pushed out by the inert gas.

With regard to the flow rate of supply of the inert gas, adjustment by the mass flow controller 119-1b is controlled by the controller 118 so that the pressure inside the gas piping 102 is rendered 10 Pa or higher based on the output of the pressure gauge 117 while an arbitrary degree of opening of the rotary valve 109-1 is maintained. As illustrated in the chart, the pressure inside the gas piping 102 increases after the valves 119-1a, 119-1c are opened and gradually decreases after reaching its local maximum.

When the controller 118 detects from output of the pressure gauge 117 that, as the above decrease gradually diminishes toward zero, the pressure inside the gas piping 102 reaches a constant value equal to or more than 10 Pa or becomes a value sufficiently approximating as being regarded to reach the value, the lid valve 109-2 is closed in response to a command from the controller 118. As a result, the interior of the processing chamber 106 is sealed except for the through holes of the shower plate 104.

Thereafter, the Step B is started from a time t4. At the time t4, the valves 119-1a, 119-1c are closed and supply of the inert gas to the gas piping 102 and the processing chamber 106 is stopped.

At a time t5, valves in the respective lines corresponding to species used in the Processing Step 2 out of the gas lines 101-1 to 101-16 are opened to supply the process gas into the gas piping 102, and the lid valve 109-2 is opened to let the process gas of the Processing Step 2 flow into the processing chamber 106 so that replacing the inert gas therein with the process gas proceeds. At this time, together with the mass flow controllers in the gas lines corresponding to the Processing Step 2, the rotation angle of the rotary valve 109-1 and the opening area of the exhaust route are adjusted to render the pressure inside the processing chamber 106 to a desired pressure based on command signals from the controller.

After it is detected that the pressure inside the processing chamber 106 is adjusted to a value suitable for the Processing Step 2, radio frequency power suitable for the conditions of the Processing Step 2 is supplied from the radio frequency power supply 122 to the electrode within the sample stage 113 and the Processing Step 2 is started at a time t6. Incidentally, the pressure inside the gas piping 102 once increases due to supply of the gas from the gas line 101, but, thereafter, gradually decreases as the pressure inside the processing chamber 106 is adjusted to that of the processing conditions.

Similar to the Processing Step 1, when it is detected by the controller 118 that the Processing Step 2 reaches its end, supply of the radio frequency power from the radio frequency power supply 122 to the sample stage 113 is stopped (at a time t7), and, then, the valves 119-1a, 119-1c are opened to supply the inert gas into the gas piping 102 (at a time t8). At this time, similar to the Step A, adjustment of the flow rate or the speed is conducted by the mass flow controller 119-1b so that the pressure inside the gas piping 102 becomes 10 Pa or higher.

At a time t9, the valves in respective lines in the gas line 101 corresponding to the types of the gases used in the Processing Step 2 are closed to stop supply of the process gas to the gas piping 102. At this time, the inert gas is continued to be supplied to the gas piping 102. When it is detected from the output of the pressure gauge that the pressure inside the gas piping 102 gradually decreases to reach a constant value equal to or more than 10 Pa or becomes a value sufficiently close as being regarded to reach the value based on the output of the pressure gauge 117, together with closure of the valve 107, the valves 119-1a, 119-1c are closed so that supply of the inert gas into the gas piping 102 is stopped.

When there are three or more steps for processing the wafer W, by closing the lid valve 109-2 in place of closing the valve 107 supply operation of the process gas used in the subsequent step is repeated by the number of the steps. No matter how many the number of steps is, as for the pressure inside the gas piping 102, in particular, the pressure in the route of the upstream side of the valve 107, the pressure of 10 Pa or higher is maintained.

Figure 3:
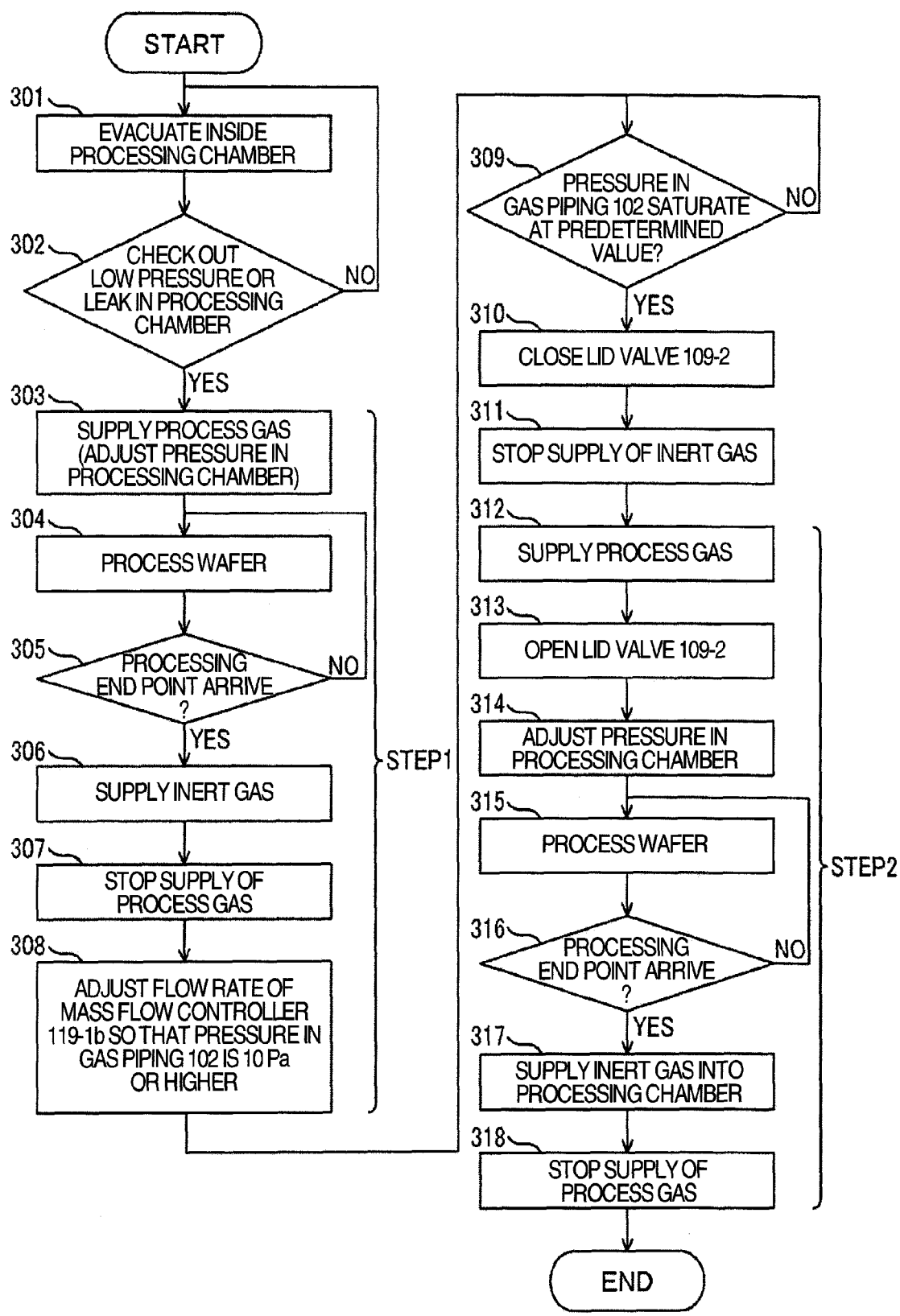
FIG. 3 is a flow chart showing an operational flow in etching processing.

FIG. 3 is a flow chart showing a flow of operations shown in FIG. 2. In this figure, a flow of operations of adjustment of the pressure inside the processing chamber 106 and processings in different processing steps of different conditions when each of a plurality of film layers arranged to be vertically laminated on the surface of the wafer W is processed sequentially (while the wafer W is left disposed within the processing chamber 106).

In this figure, a gate of the lower vessel 124 is closed and sealed by a not-shown gate valve whereas the wafer W is not mounted on the mounting surface of the sample stage 113. Thereafter, regarding implementation of processing conditions for the processing step to process the topmost film, first of all, the interior of the processing chamber 106 is evacuated through driving of the vacuum pump 108 while the wafer W is held on the sample stage 113 (Step 301).

In the step of evacuation, operation of the rotary valve 109-1 is adjusted so that it is decompressed to a pressure value of a higher degree of vacuum than the pressure value during processing in the Processing Step 1. Namely, evacuation is continued even during the evacuation until it is detected whether the pressure inside the processing chamber 106 has reached the above predetermined pressure and, when having reached is detected by the controller, it moves to the next step to start the Step 1 (Step 302). Incidentally, in this step, after it reaches a high degree of vacuum, detection of existence of leaks in seals in and out of the processing chamber 106 (leak check) may be performed by closing the lid valve 109-2 to interrupt the exhaust and detecting change of the pressure inside the processing chamber 106.

Thereafter, the gate valve is opened, the wafer W held on the arm of a not-illustrated transfer robot is transferred into the processing chamber 106, it is mounted and held on the mounting surface of the sample stage 113, and then a process gas is introduced from a plurality of through holes of the shower plate 104 over the processing chamber 106. The introduced gas is supplied from at least one gas line selected from the gas lines 101-1 to 101-16 so as to have the amount and a composition of substances suitable for processing of the Processing Step 1, its flow rate or speed is adjusted by the mass flow controllers in the corresponding lines based on a command signal from the controller 118, and the gas is supplied from the corresponding gas lines through the gas piping 102 to which they merge into the processing chamber 106.

Together with the above operation, by adjustment of the cross-sectional area of the exhaust flow channel due to rotation of the rotary valve 109-1 underneath the unblocked opening 125 the amount of exhaust of the processing chamber 106 by the vacuum pump 108 is adjusted, and adjustment is performed so that the pressure inside the processing chamber 106 approaches to a predetermined value suitable for the Processing Step 1 depending on a ratio of the amount of exhaust and the flow rate or speed of the process gas from the shower plate 104 (Step 303). The exhaust and the supply of the process gas are continued until it is detected that a predetermined pressure value suitable for the Processing Step 1 is reached; once reaching the expected pressure is detected, electric and magnetic fields are supplied into the processing chamber 106, the plasma 110 is formed, radio frequency power is supplied to the sample stage 113, and processing of the Step 1 is initiated (Step 304).

After the start of processing of the Step 1, arrival of an end point of the processing is detected and determined at a prescribed interval during the processing (Step 305). When it is determined that the end point has not arrived, the flow returns to Step 304 so that the processing continues while the pressure inside the processing chamber is adjusted. When arrival of the end point is determined, on the other hand, after the valves 119-1a, 119-1c in the gas line 119-1 are opened to introduce the inert gas into the gas piping 102 and the inert gas is supplied into the processing chamber 106 (Step 306), the valves in the gas lines used in the Processing Step 1 out of the gas lines 101-1 to 101-16 are closed and supply of the process gas to the gas piping 102 and into the processing chamber 106 is stopped (Step 307). At this time, the valve 107 is kept to be in its opened state.

With respect to the flow rate to supply the inert gas, operation of the mass flow controller 119-1b is adjusted so that the pressure inside the gas piping 102 is 10 Pa or higher while the rotary valve 109-1 is kept at a certain degree of opening according to a command signal from the controller 118 (Step 308). As illustrated in FIG. 2, after the pressure inside the gas piping 102 once increases and gradually decreases, it is detected whether or not it approaches an arbitrary pressure of 10 Pa or higher and becomes stable (Step 309), and the supply of the inert gas is continued until it is determined that the pressure is stabilized at a value of 10 Pa or higher. When it is detected, on the other hand, the lid valve 109-2 is closed to cut off the processing chamber 106 and the vacuum pump 108 (Step 310) and the supply of the inert gas is stopped (Step 311).

As the processing chamber 106 and the vacuum pump 108 are kept cut-off from each other, gas lines corresponding to the gases of the species used in the Processing Step 2 out of the gas lines 101-1 to 101-16 are opened to supply process gas to the gas piping 102 (Step 312), the lid valve 109-2 is opened (Step 313), and the pressure inside the processing chamber 106 is adjusted to become a value suitable for the processing conditions of the Processing Step 2 with operation of the vacuum pump 108 (Step 314).

When it is detected that the pressure becomes the predetermined value, electric and magnetic fields are supplied into the processing chamber 106 to form the plasma 110, and radio frequency power is supplied to the sample stage 113 to start the Processing Step 2 of the wafer W (Step 315). After starting the processing, it is detected whether an end point of the processing has arrived or not at a predetermined interval during processing (Step 316). When it is determined that the processing end point has not arrived, the processing is continued; when it is detected that the processing end point has arrived, the inert gas is supplied into the processing chamber 106 (Step 317) in a similar operation to Step 306 and, then, supply of the process gas is stopped (Step 318). Thereafter, when other films to be processed exist, the aforementioned steps are repeated.

Figure 4:
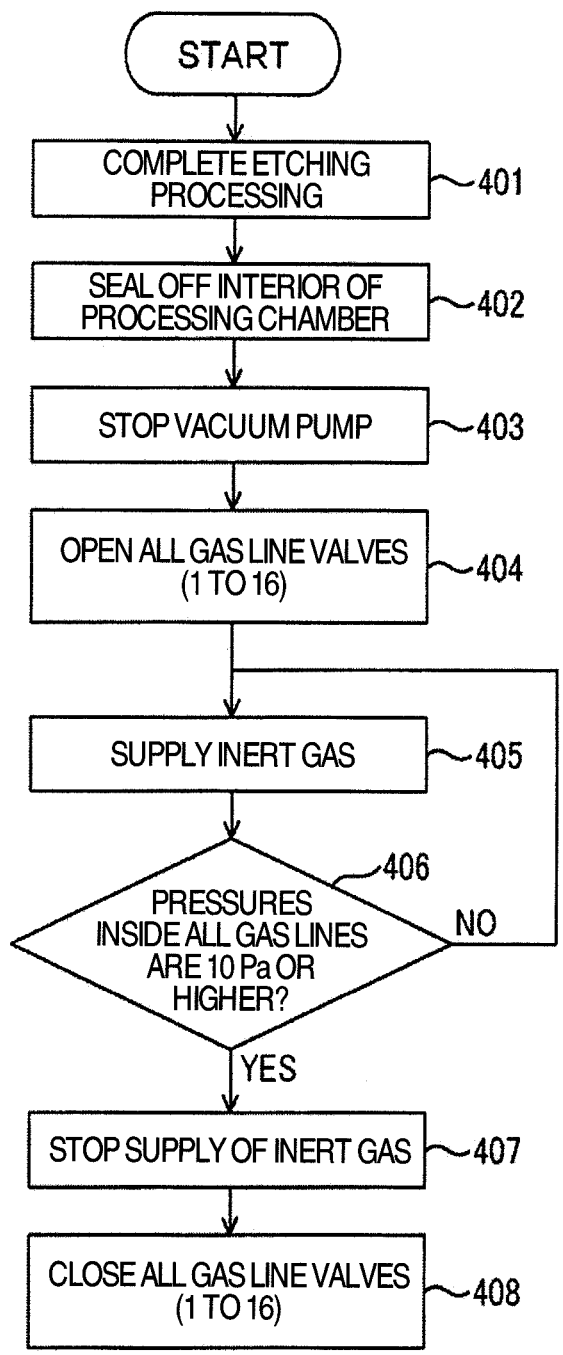
FIG. 4 is a flow chart showing a flow of enclosure operation of an inert gas when the apparatus is down for maintenance in Embodiment 1 of the present invention.

FIG. 4 is a flow chart showing a flow of enclosure operation of the inert gas when the plasma processing apparatus according to the embodiment shown in FIG. 1 is down for maintenance. In this figure, it is detected that the processing of the arbitrary wafer W is completed (Step 401), in the present embodiment, the lid valve 109-2 is closed to cut off between the interior of the processing chamber 106 and the inlet of the vacuum pump 108 so that the interior of the processing chamber 106 is sealed off except for the through holes of the shower plate 104 (Step 402).

Thereafter, the vacuum pump 108 is stopped (Step 403), all the valves 101-1a to 101-16a in the gas lines 101-1 to 101-16 are opened (Step 404), and, then, the valve 119-1a of the gas line 119-1 is opened to supply the inert gas to the interiors of all of the processing chamber 106, the gas piping 102, and the gas lines 101-1 to 101-16 (Step 405). At this time, the valves 101-1c to 101-16c may be closed. The supply of the inert gas is continued until the pressure values inside the gas lines 101-1 to 101-16, the processing chamber 106, and the gas piping 102 become 10 Pa or higher and are stabilized (Step 406); when it is detected that the pressure value inside the gas piping 102 becomes 10 Pa or higher and stabilized, the valve 119-1a is closed to stop supply of the inert gas (Step 407).

Next, the valves 101-1a to 101-16a in the gas lines 101-1 to 101-16 are closed (Step 408) and the inert gas fills the gas lines 101-1 to 101-16, the gas piping 102, and the processing chamber 106 so that vaporization of metallic components on the inner surfaces is reduced by keeping the values of the internal pressures thereof equal to or higher than values of vaporization pressures of compounds of materials of the inner surfaces thereof. By this, flow of components of the metallic material which constructs routes of the gas supply into the processing chamber 106 is suppressed and contamination of the wafer W is reduced.

Figure 5:
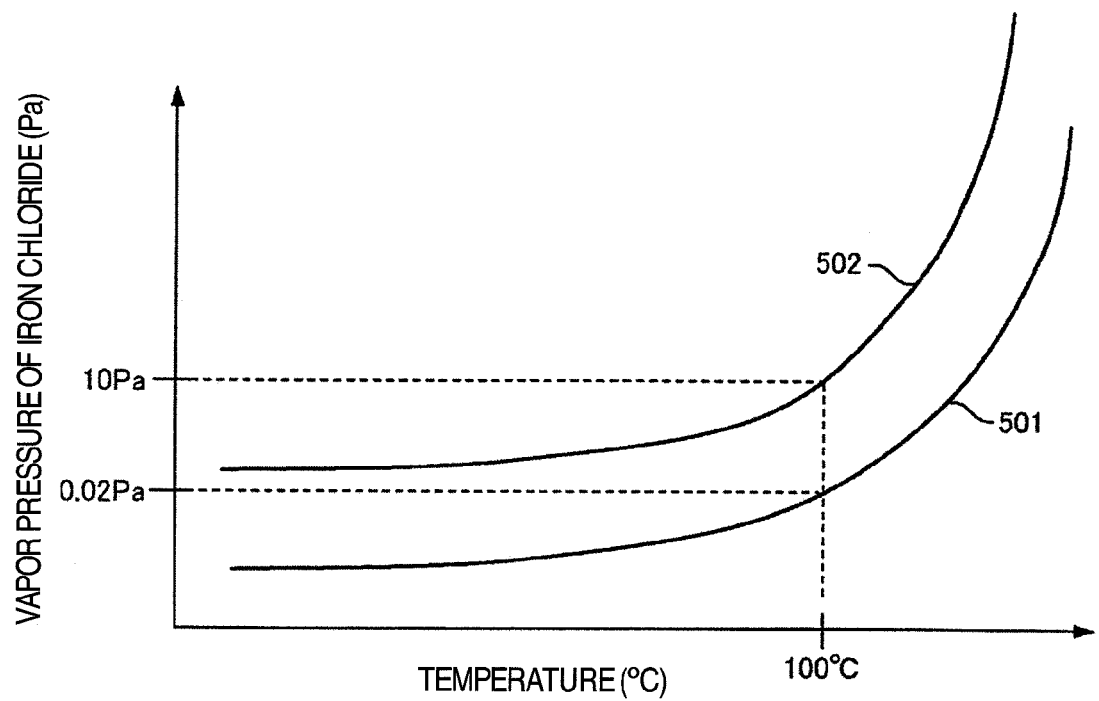
FIG. 5 is a graph showing relationships between vapor pressure and temperature for iron chlorides.

FIG. 5 is a graph showing relationships between vapor pressure and temperature for iron chlorides. An abscissa denotes temperature of a system and an ordinate denotes vapor pressure of iron chloride.

A curve 501 is obtained from thermodynamic constants of most stable, solid iron chloride ($FeCl_3$) and of a most stable, gas molecule ($Fe_2Cl_6$) in the vicinity of the processing pressure with calculation of equilibrium compositions The vapor pressure of iron chloride is $\frac{1}{10}$ or less of the etching processing pressure (0.1 to 3 Pa) at temperatures near 120° C. and is 50 to 100 times of the etching processing pressure at 200° C.; it is known from the graph that it largely increases between 120° C. and 200° C. This corresponds to the amount of an iron component coming out from parts made of stainless steel and it is indicated that it is important to keep temperatures of stainless steel members 120° C. or lower at highest in order to reduce contamination.

A curve 502 is a threshold provided to prevent vaporization of iron chloride, considering the accuracies of the pressure gauge and the mass flow controllers and the conductance of the interiors of the piping. Metallic contamination of a substrate to be etch-processed is reduced by maintaining the pressure inside the gas piping equal to or above that of the curve 502.

Embodiment 2

Figure 6:
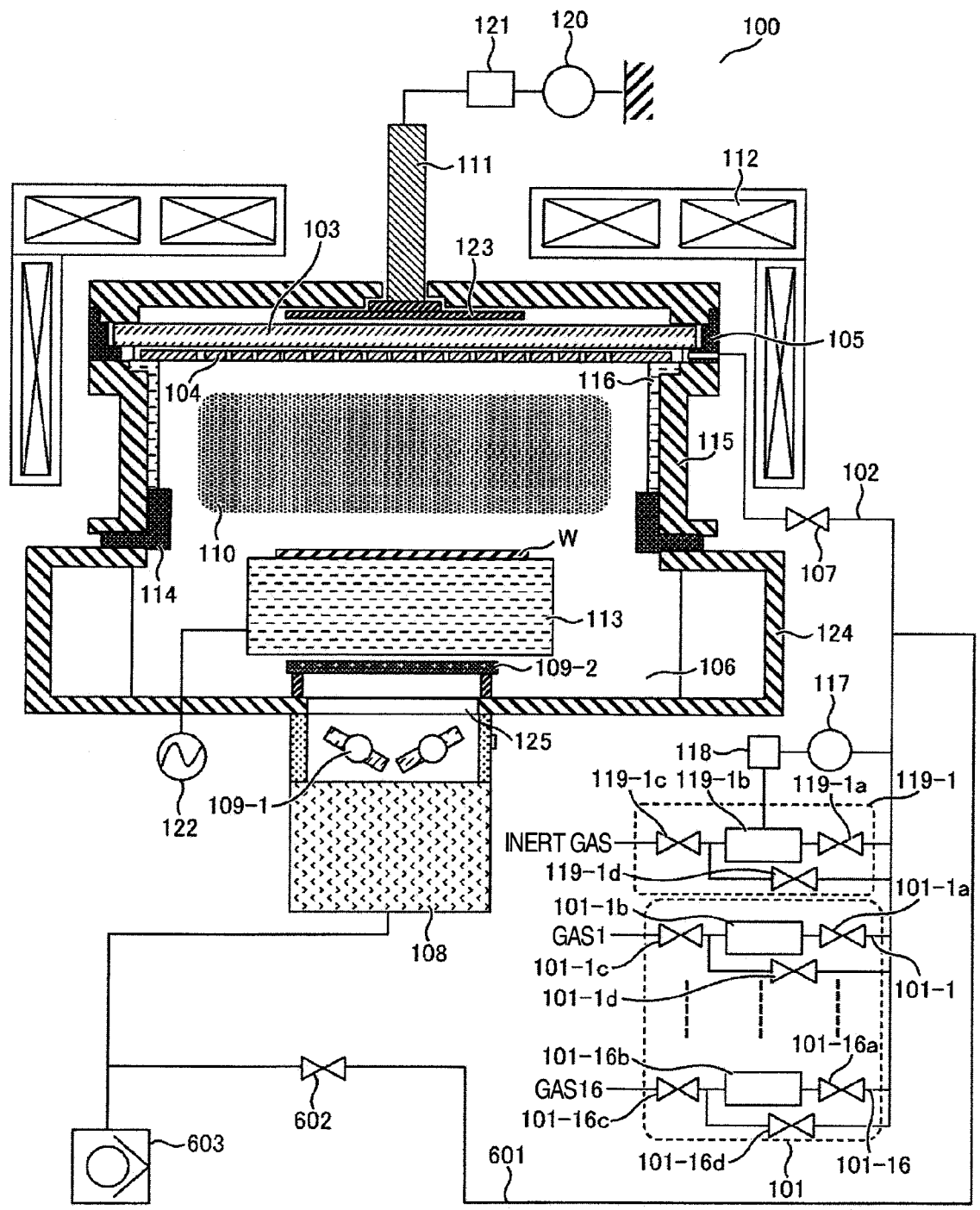
FIG. 6 is a vertical cross section of a plasma etching apparatus in accordance with Embodiment 2 of the present invention.

FIG. 6 is a vertical cross section showing a schematic of a configuration of a plasma processing apparatus according to a modification (Embodiment 2) of the embodiment shown in FIG. 1. The differences between the present embodiment and the embodiment shown in FIG. 1 are that it is equipped in the present embodiment with a junction with a bypass line 601, one end of which is connected to an inlet of a roughing pump 603, between the junction of the gas lines 101-1 to 101-16 or the gas line 119-1 and the valve 107 in the gas piping 102 and that each of the gas lines 101-1 to 101-16 and the gas line 119-1 is provided with purge lines 101-1d to 101-16d, 119-1d, which are connected to the bypass line 601 as routes for purging gas, respectively.

In the bypass line 601 between the inlet of the roughing pump 603 and the junction, a valve 602 for opening and closing a flow channel or gas flow in the bypass line 601 is arranged. The roughing pump 603 is usually an exhaust pump connected to the exit port of the vacuum pump 108 such as a turbo-molecular pump; it can evacuate the interior of the processing chamber 106 in such a relatively high pressure range that the turbo-molecular pump has a low pumping efficiency or cannot evacuate at all and, by being equipped with a combination of the turbo-molecular pump and the roughing pump connected in series upstream and downstream thereof, the plasma processing apparatus 100 can efficiently evacuate the interior of the processing chamber 106 from the atmospheric pressure to a decompressed state of a high degree of vacuum.

In the present embodiment shown is an example where the inert gas is supplied into the bypass line 601, the gas lines 101-1 to 101-16, and the gas piping 102 when the pressure in the processing chamber 106 is increased up to the atmospheric pressure to open the interior of the processing chamber (atmospheric exposure) for conducting maintenance or inspection of the interior of the processing chamber 106 or the like, after completion of processing of the wafer W in the processing chamber 106 of the plasma processing apparatus 100 is detected and the wafer W is transferred out of the processing chamber 106, but the process gas or the inert gas is not supplied into the processing chamber 106. A flow of operations when maintenance such as upkeeping or inspection is carried out for the plasma processing apparatus 100 is explained along with FIG. 7.

Figure 7:
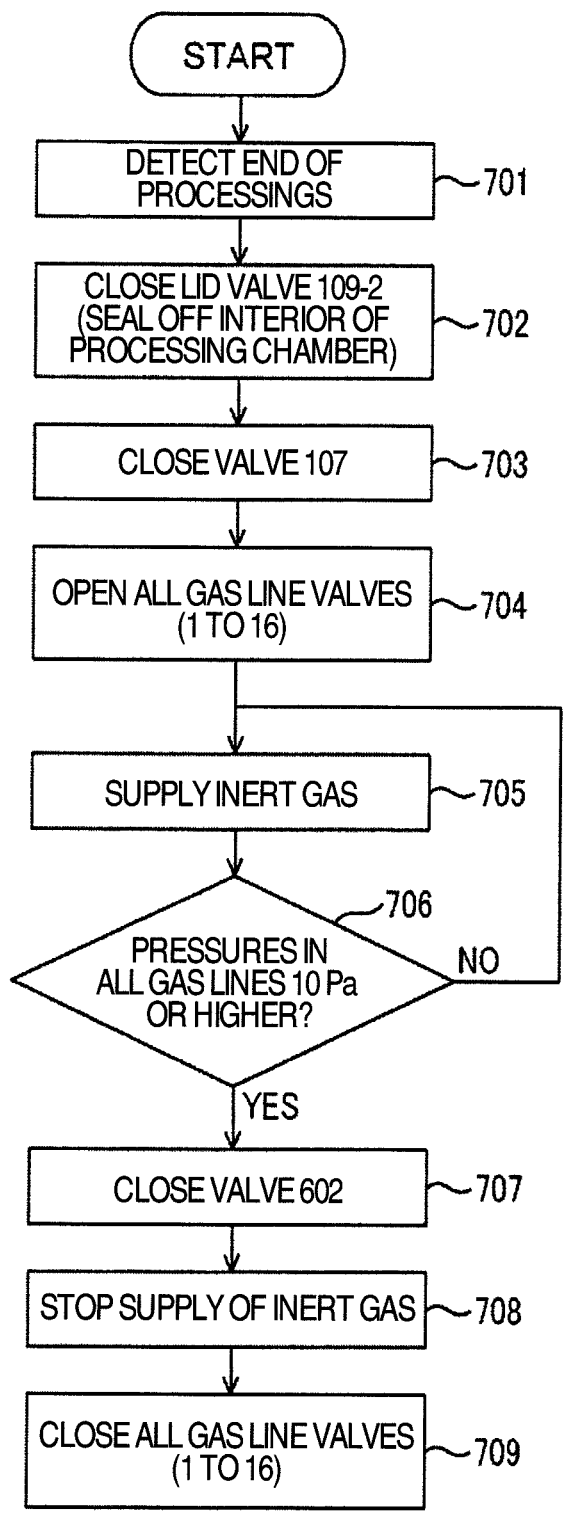
FIG. 7 is a flow chart showing a flow of enclosure operation of an inert gas when the apparatus is down for maintenance in Embodiment 2 of the present invention.

FIG. 7 is a flow chart showing a flow of introduction operation of an inert gas at the time of maintenance of the plasma processing apparatus in accordance with Embodiment 2 shown in FIG. 6. In the present embodiment, when it is detected that processings of a predetermined number of wafers W in the processing chamber 106 are completed by the controller 118 (Step 701), the lid valve 109-2 is closed to cut off the between the processing chamber 106 and the vacuum pump 108 so that the opening 125 is closed hermetically and the interior of the processing chamber 106 is sealed off except for the through holes of the shower plate 104 (Step 702). Thereafter, confirmation of sealing or presence of a leak of the processing chamber 106 may be checked by detecting a change in the pressure inside the processing chamber 106.

Thereafter, the valve 107 is closed (Step 703) and the valves 101-1a to 101-16a in the gas lines 101-1 to 101-16 are opened (Step 704). At that time, the valves 101-1c to 101-16c and the valves 119-1a, 119-1c may be in their closed state. In this case, various sorts of process gases in the gas lines 101-1 to 101-16 on the downstream sides of the valves 101-1c to 101-16c flow to the inlet of the roughing pump 603 through the purge lines 101-1d to 101-16d provided to respective lines or the bypass line 601 and then exhausted therefrom.

Next, the valves 119-1a, 119-1c are opened to let the inert gas be introduced into the respective interiors of the gas piping 102, the gas lines 101-1 to 101-16, and the bypass line 601 and the inert gas passes through the bypass line 601 to flow to the roughing pump 603 and then to be exhausted therefrom (Step 705). The supply of the inert gas continues until it is detected the internal pressures of these gas routes are made to be values of 10 Pa or higher. Similar to the embodiment of FIG. 1, the internal pressures of the gas piping 102, the gas lines 101-1 to 101-16, and the bypass line 601 once increase at their initial stages when the inert gas is supplied thereto and, thereafter, gradually decrease to approach specific values. The flow rate of the inert gas is adjusted by the operation of the mass flow controller 119-1b based on a command signal from the controller 118 so that the specific values become 10 Pa or higher (Step 706).

When it is detected that the pressures are stabilized to the specific values of 10 Pa or higher, the valve 602 is closed according to a command from the controller 118 (Step 707), and the valve 119-1a is closed to stop introduction of the inert gas (Step 708). Further, the valves 101-1a to 101-16a in the gas lines 101-1 to 101-16 are closed (Step 709).

In this way, the inert gas is supplied into the bypass line 601, the gas piping 102, and the gas lines 101-1 to 101-16 and filled so that, whereas the pressures thereof are kept higher than the pressure at which vaporization of compounds of the materials of the inner surfaces of the gas passages constituting these gas routes, atmospheric exposure can be executed and maintenance can be conducted. By this, contamination of the wafer W at the time when processing of the wafer W initiated after the maintenance, in particular, contamination by components of metallic materials of the inner surfaces of the flow channels constituting the gas routes can be reduced.

As described above, in accordance with the embodiments of the present invention, there can be implemented a plasma processing apparatus or a plasma processing method in which contamination of the wafer W is reduced and a processing yield is improved.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma processing method comprising the steps of
mounting a sample having film layers to be processed formed thereon on a sample stage disposed in a processing chamber in a vacuum vessel;
supplying a process gas into space above the sample stage in the processing chamber;
forming plasma in the space;
processing the sample; and
maintaining a pressure in a process gas supply piping at a pressure higher than a pressure at which a compound of the process gas and a material of an inner wall of the process gas supply piping vaporizes by supplying an inert gas into the process gas supply piping from an inert gas supply route connected to and communicated with the process gas supply piping when processing of the sample is completed.

2. The plasma processing method according to claim 1, wherein the step of maintaining the pressure in the process gas supply piping at the pressure higher than the pressure at which the compound vaporizes is performed using a valve which opens and closes the inert gas supply route and an adjuster which adjusts a flow rate of the inert gas, both of which are provided in the inert gas supply route.

3. The plasma processing method according to claim 2, wherein the pressure to be maintained higher than the pressure at which the compound vaporizes is set based on a detected temperature of the process gas supply piping.

4. The plasma processing method according to claim 1, wherein the pressure to be maintained higher than the pressure at which the compound vaporizes is set based on a detected temperature of the process gas supply piping.

\* \* \* \* \*